United States Patent
Xianyu et al.

(10) Patent No.: US 7,662,678 B2
(45) Date of Patent: Feb. 16, 2010

(54) METHOD OF FORMING A MORE HIGHLY-ORIENTED SILICON LAYER AND SUBSTRATE HAVING THE SAME

(75) Inventors: Wenxu Xianyu, Suwon-si (KR); Hans S. Cho, Seoul (KR); Takashi Noguchi, Yongin-si (KR); Young-Soo Park, Suwon-si (KR); Xiaoxin Zhang, Yongin-si (KR); Huaxiang Yin, Yongin-si (KR); Hyuck Lim, Seoul (KR); Kyung-Bae Park, Seoul (KR); Suk-Pil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 588 days.

(21) Appl. No.: 11/473,067

(22) Filed: Jun. 23, 2006

(65) Prior Publication Data
US 2006/0292313 A1 Dec. 28, 2006

(30) Foreign Application Priority Data
Jun. 24, 2005 (KR) .............. 10-2005-0055111

(51) Int. Cl.
*H01L 21/00* (2006.01)
*H01L 29/76* (2006.01)
(52) U.S. Cl. .................. 438/150; 438/166; 438/486; 257/66; 257/70
(58) Field of Classification Search ............. 438/149, 438/150, 151, 166, 308, 486, 487; 257/64, 257/65, 66, 67, 69, 70
See application file for complete search history.

(56) References Cited

U.S. PATENT DOCUMENTS

| | | | | |
|---|---|---|---|---|
| 4,976,809 A | * | 12/1990 | Broadbent | ............... 438/662 |
| 2005/0142707 A1 | * | 6/2005 | Kim et al. | ............... 438/166 |
| 2007/0259487 A1 | * | 11/2007 | Park et al. | ............... 438/166 |

FOREIGN PATENT DOCUMENTS

JP 2004051446 A * 2/2004

OTHER PUBLICATIONS

J. I. Eldridge et al., "Thermal Oxidation of Single-Crystal Aluminum at 550°C" Oxidation of Metals, vol. 30, Nos. 5/6 © 1988.
Makoto Ishida et al., "Double SOI Structures and Devices Applications with Heteroepitaxial $Al_2O_3$ and Si" Japanese Journal of Applied Physics vol. 34, pp. 831-835, Part 1, No. 2B, © 1995.

* cited by examiner

*Primary Examiner*—Kevin M Picardat
(74) *Attorney, Agent, or Firm*—Harness, Dickey & Pierce, P.L.C.

(57) ABSTRACT

Provided are methods of forming a more highly-oriented silicon thin layer having a larger grain size, and a substrate having the same. The methods may include forming an aluminum (Al) layer on a base substrate, forming a more highly-oriented Al layer by recrystallizing the Al layer under vacuum, forming a more highly-oriented $\gamma$-$Al_2O_3$ layer on the more highly-oriented Al layer and/or epitaxially growing a silicon layer on the more highly-oriented $\gamma$-$Al_2O_3$ layer. The method may be used to manufacture a semiconductor device having higher carrier mobility.

27 Claims, 6 Drawing Sheets

COOLING

METHOD OF FORMING A MORE HIGHLY-ORIENTED SILICON LAYER AND SUBSTRATE HAVING THE SAME

PRIORITY STATEMENT

This application claims the benefit of priority under 35 U.S.C. § 119 from Korean Patent Application No. 10-2005-0055111, filed on Jun. 24, 2005, in the Korean Intellectual Property Office, the disclosure of which is incorporated herein in its entirety by reference.

BACKGROUND OF THE INVENTION

1. Field of the Invention

Example embodiments of the present invention relate to methods of forming a more highly-oriented silicon layer and a substrate having the same. Other example embodiments of the present invention relate to methods of forming a more highly-oriented silicon layer having a larger grain size on an insulation substrate.

1. Description of the Related Art

In the field of display devices, flat panel displays are increasingly being used. Representative flat panel displays may be liquid crystal displays (LCDs), plasma display panels (PDPs) and/or organic light emitting devices (OLEDs). The development and production OLEDs is becoming increasingly common. LCDs and OLEDs driven by thin film transistors (TFTs) may have higher image quality and/or higher resolution. Larger-sized LCDs and OLEDs are also being developed. LCDs and OLEDs are also increasingly used in smaller size mobile displays (e.g., cellular phones).

Thin film transistors based on either amorphous silicon (A-Si) or polycrystalline silicon (poly-Si) are commonly used as switching devices.

Mobility of A-Si TFTs may be less than 1 cm$^2$/Vsec. A-Si TFTs may be used as pixel transistors and driver integrated-circuits (ICs) may be externally mounted, increasing the cost and/or volume of the display system. Low temperature poly-silicon (LTPS) TFTs and system on glass (SOG) having no external driver ICs have increasingly been researched. If all external driver ICs are integrated on a glass substrate (e.g., a panel), connection wires between the panel and the external driver ICs may be unnecessary, decreasing defects generated in a TFT LCD and increasing the reliability of the TFT LCD. It may be a desired objective to manufacture a SOG having a panel in which a display system including data driver ICs, gate driver ICs and/or controllers are integrated. To obtain such an objective, it is desirous to obtain an LTPS having a mobility higher than 400 cm$^2$/Vsec and a desired uniformity. However, the LTPS formed using conventional methods (e.g., excimer laser annealing (ELA), sequential lateral solidification (SLS) or metal-induced lateral crystallization (MILC)) may not achieve the desired quality.

Methods of forming polycrystalline silicon include a method of directly depositing polycrystalline silicon and a method in which amorphous silicon may be deposited and crystallized to form polycrystalline silicon.

Methods of directly depositing polycrystalline silicon may include a low pressure chemical vapor deposition (LPCVD), a plasma enhanced chemical vapor deposition (PECVD) or similar method. In the PECVD method, the deposition may be performed using a mixed gas at a temperature lower than 400° C. The PECVD method may not control grain characteristics of the polycrystalline silicon film. In particular, the orientation of grains of the polycrystalline silicon may not be uniform using the PECVD method such that the characteristics of a resulting polycrystalline silicon thin film may be degraded.

SUMMARY OF THE INVENTION

Example embodiments of the present invention relate to methods of forming a more highly-oriented silicon layer and a substrate having the same.

Example embodiments of the present invention provide methods of forming a more highly-oriented silicon layer having a larger grain size on an insulation substrate such as a glass substrate.

According to example embodiments of the present invention, there is provided a method of forming a more highly-oriented silicon layer including forming an aluminum (Al) layer on a base substrate, forming a more highly-oriented Al layer by recrystallizing the Al layer under vacuum, forming a more highly-oriented γ-Al$_2$O$_3$ layer on the more highly-oriented Al layer and/or epitaxially growing a silicon layer on the more highly-oriented γ-Al$_2$O$_3$ layer.

According to other example embodiments of the present invention, there is provided a method of forming a more highly-oriented silicon layer including forming an Al layer on a base substrate, simultaneously forming a more highly-oriented Al layer and a more highly-oriented γ-Al$_2$O$_3$ layer on the more highly-oriented Al layer by recrystallizing and oxidizing the Al layer and/or epitaxially growing a silicon layer on the more highly-oriented γ-Al$_2$O$_3$ layer.

According to still other example embodiments of the present invention, there is provided a substrate having a more highly-oriented silicon layer. The substrate having the more highly-oriented silicon layer may include a base substrate, a more highly-oriented Al layer formed on the base substrate, a more highly-oriented γ-Al$_2$O$_3$ layer formed on the more highly-oriented Al layer and/or a more highly-oriented silicon layer formed on the more highly-oriented γ-Al$_2$O$_3$ layer.

BRIEF DESCRIPTION OF THE DRAWINGS

Example embodiments of the present invention will be more clearly understood from the following detailed description taken in conjunction with the accompanying drawings. FIGS. 1-6 represent non-limiting, example embodiments of the present invention as described herein.

FIG. 1 is a scanning electron microscopic (SEM) image of an aluminum (Al) thin film crystallized using excimer laser annealing (ELA);

FIG. 2 is an x-ray diffraction pattern (XRD) of an Al thin film crystallized using excimer laser annealing;

DETAILED DESCRIPTION OF EXAMPLE EMBODIMENTS

Figure 1:
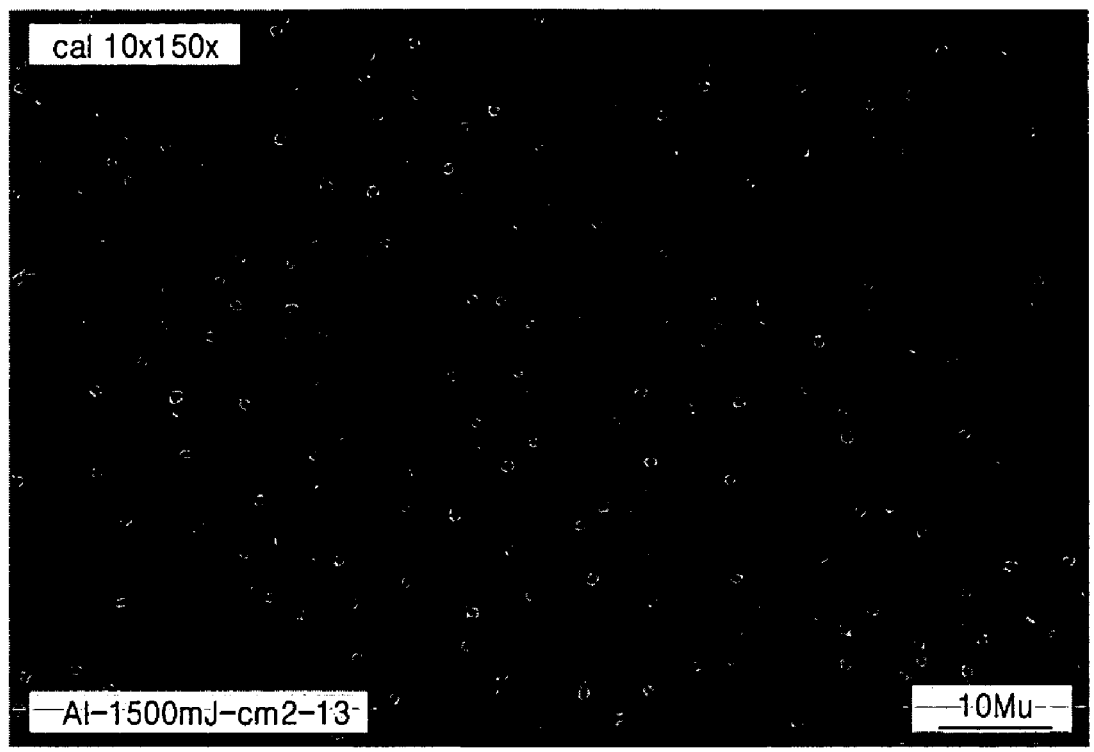

Various example embodiments of the present invention will now be described more fully with reference to the accompanying drawings in which some example embodiments of the invention are shown. In the drawings, the thicknesses of layers and regions may be exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments of the present invention.

Spatially relative terms, such as "beneath", "below", "lower", "above", "upper" and the like, may be used herein for ease of description to describe one element or a feature's relationship to another element or feature as illustrated in the Figures. It will be understood that the spatially relative terms are intended to encompass different orientations of the device in use or operation in addition to the orientation depicted in the Figures. For example, if the device in the Figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Also, the use of the words "compound," "compounds," or "compound(s)," refer to either a single compound or to a plurality of compounds. These words are used to denote one or more compounds but may also just indicate a single compound.

Example embodiments of the present invention are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments of the invention should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope of the present invention.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments of the present invention belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments of the present invention, various aspects of the present invention will be described in detail with reference to the attached drawings. However, the present invention is not limited to the example embodiments described.

Hereinafter, the present invention will be described more fully with reference to the accompanying drawings, in which example embodiments of the invention are shown Example embodiments of the present invention relate to methods of forming a more highly-oriented silicon layer and a substrate having the same. Other example embodiments of the present invention relate to methods of forming a more highly-oriented silicon layer having a larger grain size on an insulation substrate.

In example embodiments of the present invention, a more highly-oriented $\gamma$-$Al_2O_3$ layer may be used as a medium to form a more highly-oriented silicon layer having a larger grain size on an insulation substrate such as a glass substrate.

A double silicon on insulation (SOI) structure formed using an epitaxy growth method is disclosed in *Jpn. J. Appl. Phys.*, Vol. 34, 1995, pp. 831-35, the contents of which are incorporated herein by reference in their entirety. In *Jpn. J. Appl. Phys.*, $\gamma$-$Al_2O_3$ layers formed on silicon substrates may have lattice mismatches ranging from 2.4 to 3.5%, which may be better than silicon on sapphire (SOS) structures having lattice mismatches ranging from 4.0 to 13.0%. A higher quality silicon layer may be epitaxially formed on an epitaxial $\gamma$-$Al_2O_3$ layer.

To form a higher quality $\gamma$-$Al_2O_3$ layer, a method of oxidizing crystalline aluminum (Al) disclosed in *Oxidation of Metals*, Vol. 30, No. 5-6, pp. 301-28, December 1988 (the contents of which are incorporated herein by reference in their entirety) may be used. According to the *Oxidation of Metals*, crystalline aluminum (Al) may be oxidized at a certain temperature and pressure, forming epitaxial $\gamma$-$Al_2O_3$ on the surface of the crystalline Al.

In example embodiments of the present invention, an aluminum (Al) layer having a larger grain size and/or higher orientation may be formed by recrystallizing an Al thin film and subsequently oxidizing the Al thin film to form a $\gamma$-$Al_2O_3$ layer having a larger grain size and/or higher orientation. When a silicon layer is epitaxially grown on the more highly-oriented $\gamma$-$Al_2O_3$ layer, the epitaxially grown silicon layer may have also a larger grain size and/or higher orientation.

In example embodiments of the present invention, an Al thin film having a thickness of about 100 nm may be formed on a silicon substrate and may be treated using excimer laser annealing (ELA) with 1500 mJ/cm$^2$ of energy density.

Figure 2:
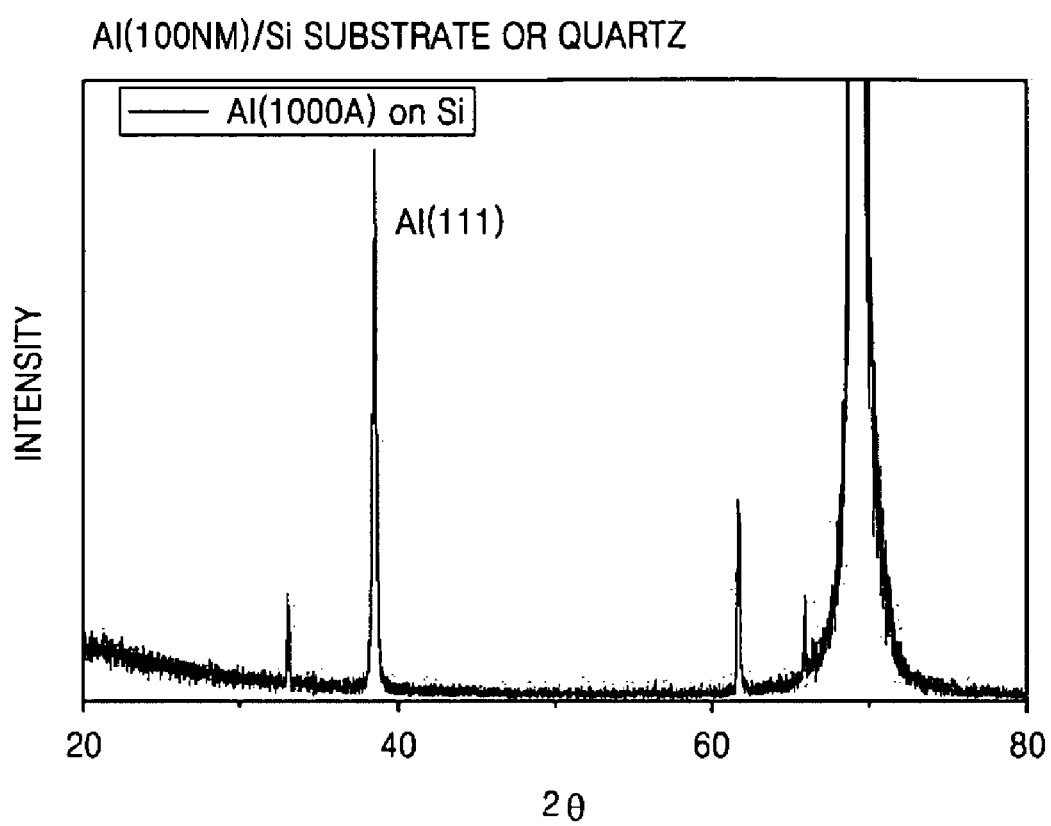

FIG. 1 is scanning electron microscopic (SEM) image of the Al thin film crystallized using excimer laser annealing (ELA). FIG. 2 is an x-ray diffraction pattern (XRD) of the Al thin film crystallized using ELA.

Referring to FIG. 1, after an excimer laser treatment, the Al thin film may have a larger grain size ranging from 5 to 10 $\mu$m. In the XRD pattern of FIG. 2, the orientation of the crystallized Al thin film may be more uniform. A higher quality Al thin film having a larger grain size and higher orientation, which may form a higher quality $\gamma$-$Al_2O_3$ layer, may be formed by recrystallizing an Al thin film.

Hereinafter, the method of forming a more highly-oriented silicon layer according to the present invention will be described more fully with reference to the example embodiments of the present invention.

Hereinafter, a method of forming a substrate having a more highly-oriented silicon layer according to example embodiments of the present invention will be described with reference to FIGS. 3A through 3E.

Figure 3A:
FIGS. 3A through 3E are diagrams illustrating sectional views of a method of manufacturing a substrate having a more highly-oriented silicon layer according to example embodiments of the present invention.

Referring to FIG. 3A, Al may be deposited on a base substrate 100 to form an Al layer 200. The base substrate 100 may be an insulation substrate (e.g., a silicon substrate, a glass substrate, or a plastic substrate).

The Al layer 200 may be formed of Al or a Ni—Al alloy. The Al layer 200 may be deposited using any commonly known method in the art (e.g., sputtering or ion beam deposition (IBD)). The deposition thickness for Al may be about 5 nm to 1 $\mu$m. Example embodiments of the present invention are not limited thereto.

Figure 3B:
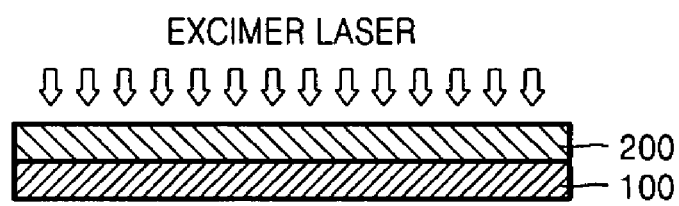
Figure 3C:

Referring to FIG. 3C, the Al layer 200 may be recrystallized to form a polycrystalline Al layer 300 having a larger grain size and a higher orientation. A layer having the larger grain size and the higher orientation will hereinafter be referred to as "the more highly-oriented layer." The Al layer 200 may be recrystallized using an excimer laser (as illustrated in FIG. 3B) or similar device.

Figure 3D:

Referring to FIG. 3D, a more highly-oriented $\gamma$-$Al_2O_3$ layer 400 may be formed on the more highly-oriented polycrystalline Al layer 300. The more highly-oriented $\gamma$-$Al_2O_3$ layer 400 may be formed by oxidizing a surface of the more highly-oriented polycrystalline Al layer 300. In order to form the more highly-oriented $\gamma$-$Al_2O_3$ layer 400 by oxidization, the more highly-oriented polycrystalline Al layer 300 may be heat-treated at about 100 to 600° C. in an oxygen-enriched atmosphere or an ozone atmosphere.

The more highly-oriented $\gamma$-$Al_2O_3$ layer 400 may also be formed on the more highly-oriented polycrystalline Al layer 300 by an epitaxial growth method such as molecular beam epitaxy (MOMBE) or an anodizing method.

The more highly-oriented $\gamma$-$Al_2O_3$ layer 400 may also be formed on the surface of the more highly-oriented polycrystalline Al layer 300 by excimer laser annealing in an oxygen-enriched atmosphere or an ozone atmosphere. The laser annealing may be performed regardless of the transition temperature of the base substrate 100.

More highly-oriented $\gamma$-$Al_2O_3$ may be further grown on the more highly-oriented $\gamma$-$Al_2O_3$ layer 400 by additional crystal growth. The additional more highly-oriented $\gamma$-$Al_2O_3$ growth may be optional.

Figure 3E:
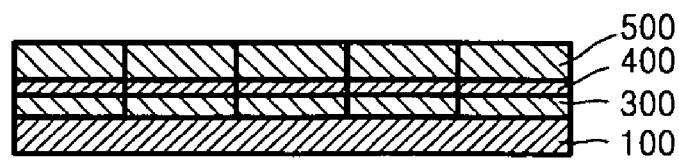

Referring to FIG. 3E, a silicon layer 500 may be epitaxially grown on the more highly-oriented $\gamma$-$Al_2O_3$ layer 400, forming a substrate having a more highly-oriented silicon layer. The epitaxial growth of the silicon layer 500 may be performed using a low pressure chemical vapor deposition (LPCVD) method or an ultra-high vacuum chemical vapor deposition (UHV CVD) method, example embodiments of the present invention are not limited thereto.

FIG. 4A through 4E are diagrams illustrating sectional views of a method of forming a more highly-oriented silicon layer according to example embodiments of the present invention. According to the example embodiments of the present invention, a more highly-oriented silicon layer may be formed by using a hot roll scanning method of recrystallizing the Al layer.

Figure 4A:
FIGS. 4A through 4E are diagrams illustrating sectional views of a method of manufacturing a substrate having a more highly-oriented silicon layer according to example embodiments of the present invention.

Referring to FIG. 4A, Al may be deposited on a base substrate 100 (e.g., a silicon substrate, a glass substrate or a plastic substrate) to form an Al layer 200.

The Al layer 200 may be formed of Al or a Ni—Al alloy. The Al layer may be deposited to a thickness of about 5 nm to 1 $\mu$m using sputtering, ion beam deposition (IBD) or similar process. Example embodiments of the present invention are not limited to the thickness of 5 nm to 1 $\mu$m.

Figure 4B:
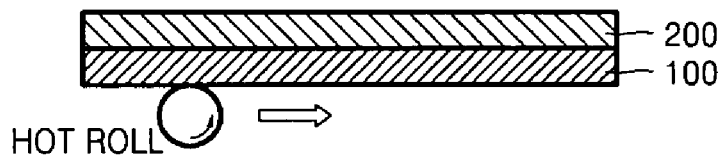
Figure 4C:

Referring to FIG. 4B, the Al layer 200 may be recrystallized using hot roll scanning to form a polycrystalline Al layer 300 having a larger grain size and/or a higher orientation, as illustrated in FIG. 4C.

Figure 4D:
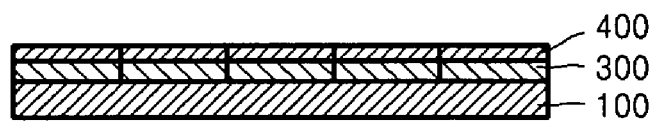

Referring to FIG. 4D, a more highly-oriented $\gamma$-$Al_2O_3$ layer 400 may be formed on the more highly-oriented Al layer 300. The more highly-oriented $\gamma$-$Al_2O_3$ layer 400 may be formed by oxidizing a surface of the more highly-oriented Al layer 300. In order to form the more highly-oriented γ-Al$_2$O$_3$ layer 400 by oxidization, the more highly-oriented Al layer 300 may be heat-treated at about 100° C. to 600° C. in an oxygen or ozone atmosphere.

Another method of forming the γ-Al$_2$O$_3$ layer 400 on the more highly-oriented Al layer 300 may be an epitaxial growth method (e.g., molecular beam epitaxy (MOMBE) or an anodizing method).

More highly-oriented γ-Al$_2$O$_3$ layer 400 may also be formed by excimer laser annealing in an oxygen-enriched atmosphere or an ozone atmosphere, as described previously.

The γ-Al$_2$O$_3$ may be further grown on the more highly-oriented γ-Al$_2$O$_3$ layer 400 by additional crystal growth. The additional more highly-oriented γ-Al$_2$O$_3$ growth is optional.

Figure 4E:
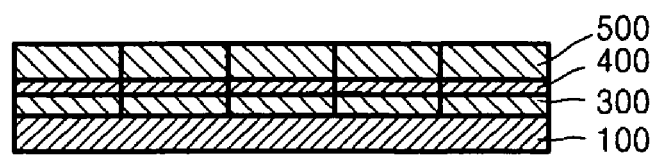

Referring to FIG. 4E, a silicon layer 500 may be grown on the more highly-oriented γ-Al$_2$O$_3$ layer 400 using LPCVD or UHV CVD (or similar method) to form a substrate having a more highly-oriented silicon layer.

According to example embodiments of the present invention, the recrystallization of the Al layer 200 may be performed using sequential lateral solidification (SLS).

According to example embodiments of the present invention, a buffer layer may be formed on the base substrate before forming the Al layer 200 in order to prevent, or retard, impurities in the base substrate from penetrating into the silicon layer 500. The buffer layer may also control the orientation of Al when the recrystallization is performed. The buffer layer may be formed of SiO$_2$, Si$_3$N$_4$, AlN or Si$_3$N$_x$O$_x$.

Methods of manufacturing a substrate having a more highly-oriented silicon layer according to example embodiments of the present invention will now be described with reference to FIGS. 5 and 6.

FIGS. 5A through 5D are diagrams illustrating sectional views of a method of manufacturing a substrate having a more highly-oriented silicon layer according to example embodiments of the present invention.

In example embodiments of the present invention, an Al layer 200 may simultaneously crystallized and oxidized to simultaneously form a more highly-oriented Al layer 300 and a more highly-oriented γ-Al$_2$O$_3$ layer 400.

Figure 5A:
FIGS. 5A through 5E are diagrams illustrating sectional views of a method of manufacturing a substrate having a more highly-oriented silicon layer according to example embodiments of the present invention.

Referring to FIG. 5A, the Al layer 200 may be formed on a substrate 100.

Figure 5B:
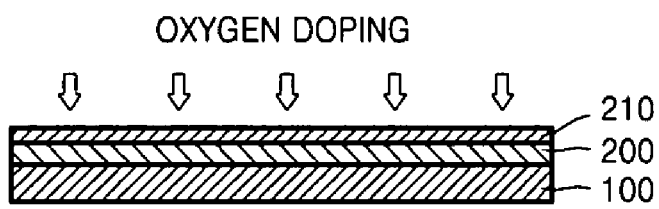

Referring to FIG. 5B, the Al layer 200 may be doped with oxygen to a desired depth to form a doped Al layer 210 on the amorphous Al layer 200.

Figure 5C:
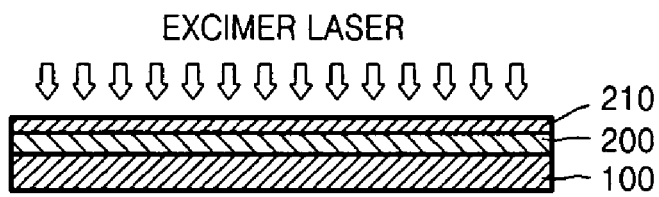
Figure 5D:
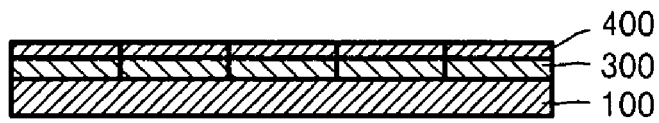

Referring to FIG. 5C, the Al layer 200 and the doped Al layer 210 formed on the Al layer 200 may be heat-treated using an excimer laser to simultaneously form the more highly-oriented Al layer 300 and the more highly-oriented γ-Al$_2$O$_3$ layer 400, as illustrated in FIG. 5D.

Figure 5E:
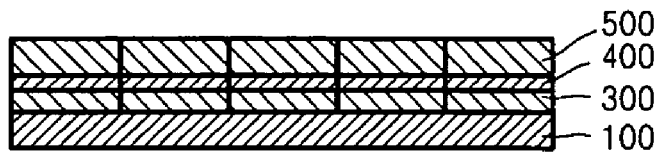

Referring to FIG. 5E, a silicon layer 500 may be epitaxially grown on the more highly-oriented γ-Al$_2$O$_3$ layer 400 to obtaining a substrate having a more highly-oriented silicon layer.

In the doping step illustrated in FIG. 5B, an interlayer formed of, for example, SiO$_2$, may be formed on the Al layer 200 in order to control the depth of the doped Al layer 210 formed on the Al layer 200. The interlayer may be removed by heat-treatment after the more highly-oriented Al layer 300 and the more highly-oriented γ-Al$_2$O$_3$ layer 400 are formed.

In other example embodiments of the present invention, the more highly-oriented Al layer 300 and the more highly-oriented γ-Al$_2$O$_3$ layer 400 may be simultaneously formed by melting an amorphous Al layer 200 in a high vacuum furnace and cooling the amorphous Al layer 200 in an oxygen-enriched atmosphere or an ozone atmosphere.

FIGS. 6A through 6D are diagrams illustrating sectional views of a method of manufacturing a substrate having a more highly-oriented silicon layer according to example embodiments of the present invention.

Figure 6A:
FIGS. 6A through 6D diagrams illustrating sectional views of a method of manufacturing a substrate having a more highly-oriented silicon layer according to example embodiments of the present invention.

Referring to FIG. 6A, an Al layer 200 may be formed on a substrate 100.

Figure 6B:

Referring to FIG. 6B, the substrate 100 having the Al layer 200 may be loaded into a high vacuum furnace to melt the Al layer 200.

Figure 6C:
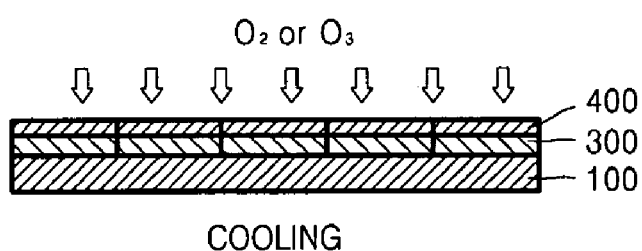

Referring to FIG. 6C, the melted Al layer 200 may be cooled in an oxygen-enriched atmosphere or an ozone atmosphere to simultaneously form the more highly-oriented Al layer 300 and the more highly-oriented γ-Al$_2$O$_3$ layer 400 on the more highly-oriented Al layer 300.

Figure 6D:
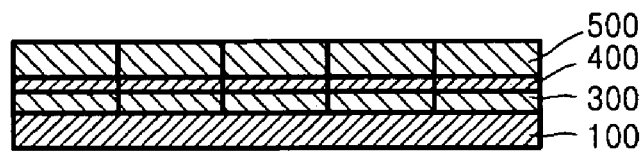

Referring to FIG. 6D, a silicon layer 500 may be epitaxially grown on the more highly-oriented γ-Al$_2$O$_3$ layer 400 to obtain a substrate having a more highly-oriented silicon layer.

The substrate having the more highly-oriented silicon layer according to example embodiments of the present invention may have a structure in which a more highly-oriented Al layer, a more highly-oriented γ-Al$_2$O$_3$ layer and a more highly-oriented silicon layer may be sequentially stacked on a base substrate. The more highly-oriented Al layer, γ-Al$_2$O$_3$ layer and silicon layer have a grain size of about 50 nm to 20μm.

The more highly-oriented silicon layer stacked substrate according to example embodiments of the present invention may be applied to a thin film transistor used as a switching device for a display to realize a system-on-glass (SOG).

The methods according to example embodiments of the present invention may provide a thin film transistor having a more highly-oriented silicon layer with a larger grain size. A semiconductor device, having the thin film transistor with a more highly-oriented silicon layer having a larger grain size, may demonstrate higher mobility. In addition, the methods according to example embodiments of the present invention may be used to perform stacking processes, producing a higher quality three-dimensional integrated circuit (IC).

The foregoing is illustrative of the example embodiments of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a more highly-oriented silicon layer, comprising:
   forming an aluminum (Al) layer on a base substrate;
   forming a more highly-oriented Al layer by recrystallizing the Al layer;
   forming a more highly-oriented γ-Al$_2$O$_3$ layer on the more highly-oriented Al layer; and epitaxially growing a silicon layer on the more highly-oriented γ-Al$_2$O$_3$ layer to form the more highly-oriented silicon layer.

2. The method of claim 1, wherein forming the more highly-oriented Al layer includes recrystallizing the Al layer under vacuum using at least one method selected from the group including excimer laser annealing (ELA), sequential lateral solidification (SLS) and hot roll scanning.

3. The method of claim 1, wherein forming the more highly-oriented γ-Al$_2$O$_3$ layer includes oxidizing the more highly-oriented Al layer.

4. The method of claim 3, wherein forming the more highly-oriented γ-Al$_2$O$_3$ layer includes thermally oxidizing the more highly-oriented Al layer in an oxygen-enriched atmosphere or an ozone atmosphere.

5. The method of claim 4, wherein thermally oxidizing is performed at a process temperature of about 100° C. to 650° C.

6. The method of claim 3, wherein forming the more highly-oriented γ-Al$_2$O$_3$ layer includes performing excimer laser annealing (EllA) on the more highly-oriented Al layer in an oxygen-enriched atmosphere or an ozone atmosphere.

7. The method of claim 3, further comprising:
epitaxially growing γAl$_2$O$_3$ on the more highly-oriented γ-Al$_2$O$_3$ layer formed by oxidizing the Al layer.

8. The method of claim 1, wherein forming the more highly-oriented γ-Al$_2$O$_3$ layer includes using an anodizing method.

9. The method of claim 1, wherein forming the more highly-oriented γ-Al$_2$O$_3$ layer includes using an epitaxial growth method.

10. The method of claim 9, wherein the epitaxial growth method is performed using metal organic molecular beam epitaxy (MOMBE).

11. The method of claim 1, wherein forming a more highly-oriented Al layer and a more highly-oriented γAl$_2$O$_3$ layer on the more highly-oriented Al layer is performed simultaneously by recrystaiiizing and oxidizing the Al layer.

12. The method of claim 11, wherein forming the more highly-oriented γ-Al$_2$O$_3$ layer includes performing excimer laser annealing (ELA).

13. The method of claim 11, wherein forming the more highly-oriented Al layer and the more highly-oriented γAl$_2$O$_3$ layer includes melting the Al layer a vacuum furnace or a rapid thermal annealing (RTA) furnace, and cooling the Al layer in an oxygen-enriched atmosphere or an ozone atmosphere.

14. The method of claim 1, wherein forming the silicon layer is includes using a low pressure chemical vapor deposition (LPCVD) method or an ultra-high vacuum chemical vapor deposition (UHV CVD) method.

15. The method of claim 11, wherein forming the silicon layer includes using a low pressure chemical vapor deposition (LPCVD) method or an ultra-high vacuum chemical vapor deposition (UHV CVD) method.

16. A substrate, comprising:
a base substrate;
a more highly-oriented Al layer formed on the base substrate;
a more highly-oriented γ-Al$_2$O$_3$ layer formed on the more highly-oriented Al layer; and
a more highly-oriented silicon layer formed on the more highly-oriented γ-Al$_2$O$_3$ layer.

17. The substrate of claim 16, wherein the Al layer is formed of one selected from the group including Al and Ni—Al alloys.

18. The substrate of claim 17, wherein the more highly-oriented Al layer has a grain size of about 50 nm to 20 μm.

19. The substrate of claim 16, wherein the more highly-oriented γ-Al$_2$O$_3$ layer has a grain size of about 50 nm to 20 μm.

20. The substrate of claim 16, wherein the silicon layer is formed of one selected from the group including silicon (Si) and silicon germanium (SiGe).

21. The substrate of claim 16, wherein the silicon layer has a grain size of about 50 nm to 20 μm.

22. The substrate of claim 16, wherein the base substrate is formed of glass.

23. The substrate of claim 16, further comprising a buffer layer formed between the Al layer and the base substrate.

24. The substrate of claim 23, wherein the buffer layer is formed of one selected from the group including SiO$_2$, Si$_3$N4, AiN and Si$_3$N$_x$O$_x$.

25. A thin film transistor comprising the substrate according to claim 16.

26. A display comprising the thin film transistor according to claim 25, wherein the thin film transistor is used as a switching device.

27. The substrate of claim 16, wherein the substrate is a silicon on insulation (SOI) substrate.

* * * * *